SLIDE SWITCH FOR USE WITH PRINTED CIRCUITS

Filed May 19, 1969 2 Sheets-Sheet 1

PHILIP H. ECKHART
THOMAS F. GOSNELL, SR
INVENTORS

BY William G. Christoforo
ATTORNEY

SLIDE SWITCH FOR USE WITH PRINTED CIRCUITS

Filed May 19, 1969

PHILIP H. ECKHART
THOMAS F. GOSNELL, SR.
INVENTORS

BY William G. Christoforo
ATTORNEY

1

3,525,828
SLIDE SWITCH FOR USE WITH PRINTED CIRCUITS

Philip H. Eckhart and Thomas F. Gosnell, Sr., Baltimore, Md., assignors to The Bendix Corporation, a corporation of Delaware Filed May 19, 1969, Ser. No. 825,603
Int. Cl. H01h 3/02, 15/04
U.S. Cl. 200—16 5 Claims

ABSTRACT OF THE DISCLOSURE

A slide switch integral within printed circuit board which is mounted perpendicular to a control panel includes a slide which carries the switch moving contacts and is constrained to move along the surface of the printed circuit board. The switch moving contacts are urged against the surface of the printed circuit board on which are laid conductive tracks comprising the switch fixed contacts. A shaft having a longitudinal axis parallel to the plane of the printed circuit board is rotatable from the control panel and carries a fixed radial link which engages a fork depending from the switch slide. Rotation of the shaft moves the slide across the surface of the printed circuit board.

BACKGROUND OF THE INVENTION

This invention relates to switches for use with printed boards and more particularly to miniature slide switches whose fixed contacts comprise conductive lands on a printed circuit board.

Recent developments in electronic packaging techniques and particularly printed circuit board and microelectronic techniques have permitted great advances in miniaturization of electronic equipment. Naturally, miniaturization of the electronic equipment has made it desirable to also miniaturize mechanically manipulated elements which cooperate with the electronic elements, for example, switches.

SUMMARY OF THE INVENTION

A miniature slide switch has been devised which comprises a slide which carries movable switch contacts and which is supported by a printed circuit board, the switch fixed contacts being conductive tracks laid upon the printed circuit board.

It is thus an object of this invention to provide a miniature slide switch for cooperation with electronic printed circuit boards.

It is another object of this invention to provide a miniature slide switch of the type described wherein the switch fixed contacts are printed circuit board lands.

DESCRIPTION OF THE PREFERRED EMBODIMENT

Figure 1:
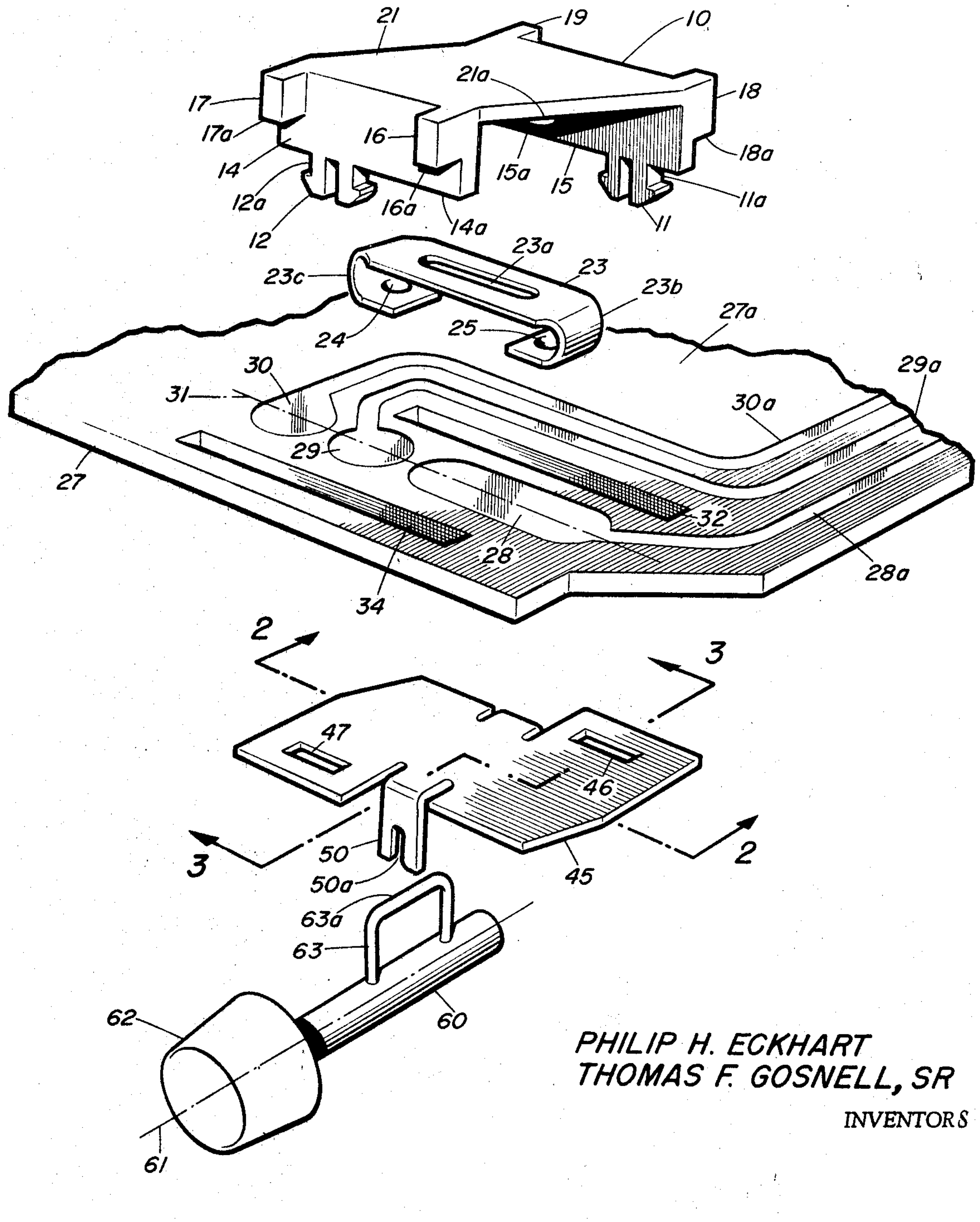
FIG. 1 is an exploded perspective view of the switch.

Referring now to the drawings where like reference numbers in the various drawings refer to identical elements and referring more particularly to FIG. 1, a printed circuit board 27 has laid on one surface thereof in a conventional manner printed circuit lands 28, 29 and 30 which connect electrically with printed circuit tracks **28*a*, 29*a*, and 30*a*, respectively. Lands 28 to 30 are aligned generally along axis 31 which runs parallel to slots 32** and

2

34 located on either side of axis 31 and which extend through the printed circuit board.

A dielectric slide 10 having a U-shaped structure wherein a recess is defined by side legs 14 and 15 and top section 21 has depending from the side legs snap tabs 11 and 12 including the notched sections thereof **11*a* and 12*a*, respectively. The purpose of these snap tabs will be explained more fully below. At each corner of the U-shaped structure is located an abutment, for example, abutments 16 to 19. These abutments reinforce the structure of the U and additionally the base of these abutments, 16*a*, 17*a*, 18*a* and 19*a* (shown in FIG. 3), comprise a bearing surface along which slide 10 will move on the surface 27*a* of printed circuit board 27 when the bottom sections 14*a* and 15*a* of leg 14 and 15 respectively are inserted into slots 34 and 32** respectively.

A generally C-shaped switch contact 23 having an elongated slot **23*a* along its longitudinal axis cooperates with a projection 21*a* arising from end wall 21 of slide 10 to align contact 23 along the longitudinal axis of slide 10, which axis will coincide with axis 31 when slide 10 is assembled to printed circuit board 27. The turned over ends 23*b* and 23*c* of contact 23 are particularly resilient since the width of the contact has been decreased somewhat in the vicinity of the bend. Contact 23 also includes protuberances 24 and 25** for making contact with the aforementioned lands on the printed circuit board as will become obvious as the description proceeds.

Figure 2:
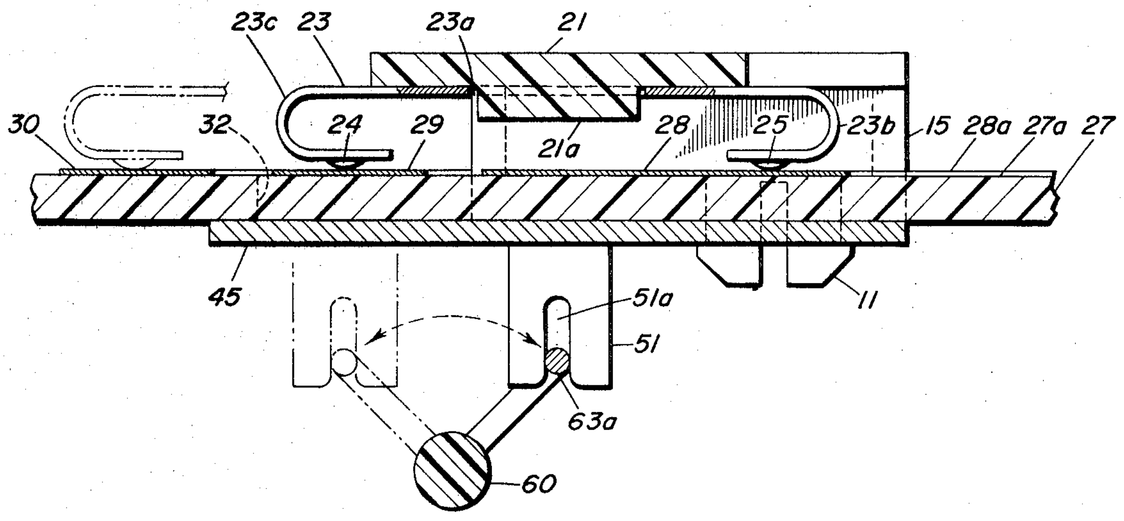
FIG. 2 is a sectional view of the slide and moving contacts assembled to a printed circuit board taken along line 2—2 of FIG. 1.
Figure 3:
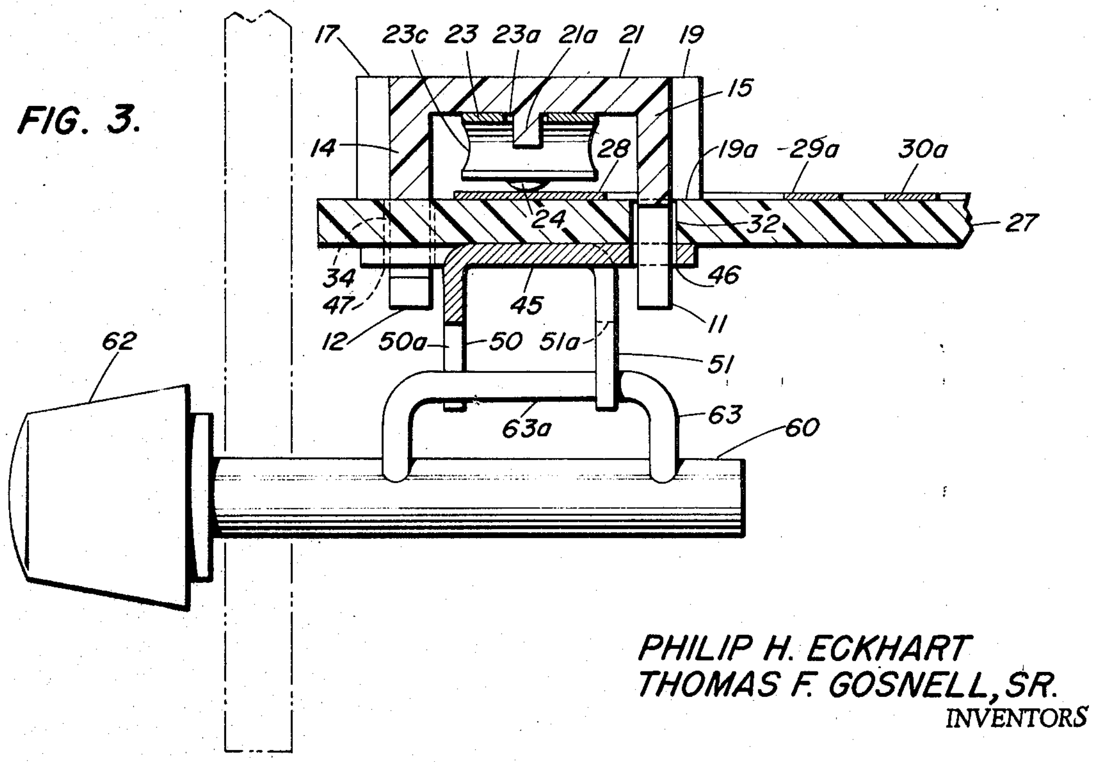
FIG. 3 is a sectional view of the switch taken along line 3—3 of FIG. 1.

With contact 23 in place in slide 10 as shown in FIGS. 2 and 3, to which reference should now also be made, and with tabs 11 and 12 extending into and through slots 32 and 34 respectively, the slide and contact assembly is captivated to printed circuit board 27 by captive means 45, which is located at the side of the printed circuit board opposite from surface **27*a* and which engages tabs 11 and 12 in slots 46 and 47 respectively, notches 11*a* and 12*a* snapping into the slots 46 and 47 to captivate the tabs therein in a manner well known in the art. Integral with captive means 45 and depending therefrom are forks 50 and 51. A shaft 60 supported in any conventional manner by bearings (not shown) is rotatable above shaft axis 16 by manipulation of knob 62 and has integral and rotatable therewith a radial linkage 63 having a crossbar 63*a* which engages into fork interspaces 50*a* and 51*a* to thereby move captive means 45 together with captive slide 10 and contact 23 along slots 32 and 34. Suitably cooperating with shaft 60 is a detent and stop means (not shown) of any suitable conventional type to permit the switch to reside in either one of two stable positions. In FIG. 2 the broken line drawing shows the switch in a first stable position while the solid line drawing shows the switch in a second stable position. In the first stable position the slide and movable contact assembly is positioned so that protuberances 24 and 25 contact lands 28 and 30 respectively, thus shunting these two lands. In the second stable switch position protuberances 24 and 25 contact lands 28 and 29 respectively thus shunting these two lands. The resiliency of contact 23 urges slide 10 away from printed circuit board surface 27*a*. However, as aforementioned, the slide is captivated to the board by captive means 45 thus causing contact protuberances 24 and 25 to be forced firmly against board surface 27*a*** thereby ensuring excellent electrical communication between the switch fixed and movable contacts.

The switch as illustrated herein is seen to be a basic single pole double throw switch. It should be obvious to one skilled in the art that the teachings of this invention can be used to construct miniature circuit board switches having other switch configurations.

The invention claimed is:

1. A switch having movable and fixed elements for use with printed circuit boards said boards having first and second surfaces and a plurality of fixed contact lands comprising said switch fixed elements laid on said first surface and slots adjacent said lands comprising:

- a dielectric slide having a generally flat bearing area for sliding on said first surface, a plurality of snap tabs depending generally normally to said bearing area through said slots, and a recess in spaced relationship with said lands;
- a resilient contact element fixedly mounted within said recess and having contact points for connecting predetermined of said lands; and,
- snap tab engagement means mounted at said second surface for engaging said snap tabs and slidably captivating said slide to said printed circuit board.

2. A switch as recited in claim 1 wherein said resilient contact element urges said slide away from said first surface and said engagement means against said second surface, said engagement means comprising a second bearing area for sliding on said second surface.

3. A switch as recited in claim 2 with additionally means for urging said switch along said printed circuit board in a direction parallel to said slots.

4. A switch as recited in claim 2 wherein said printed circuit board slots comprise first and second parallel slots, one on either side of said lands, said lands being arranged parallel to said slots and wherein said dielectric slide comprises a generally U-shaped structure having first and second legs and elongated along a longitudinal axis, said U-shape being inverted over said first surface and extended from said first to said second slot, said longitudinal axis being parallel to said slots and said recess comprising the interior of said U between said first and second legs.

5. A switch as recited in claim 4 wherein said urging means comprises:

- a fork integral with the movable elements of said switch; and,
- a linkage having a fulcrum fixed with respect to said printed circuit board and a moving end cooperating with said fork.

References Cited

UNITED STATES PATENTS

| | | | |
|---|---|---|---|
| 3,306,994 | 2/1967 | Bassett | 200—16 |
| 3,311,719 | 3/1967 | Vananzi | 200—16 |
| 3,329,778 | 7/1967 | Bedocs | 200—16 |
| 3,413,431 | 11/1968 | Bang | 200—16 XR |
| 3,461,256 | 8/1969 | Ferryman | 200—16 XR |

ROBERT K. SCHAEFER, Primary Examiner

J. R. SCOTT, Assistant Examiner

U.S. Cl. X.R.

200—172